(12) United States Patent
Tanioka et al.

(10) Patent No.: US 6,433,410 B2
(45) Date of Patent: Aug. 13, 2002

(54) SEMICONDUCTOR DEVICE TESTER AND METHOD OF TESTING SEMICONDUCTOR DEVICE

(75) Inventors: Michinobu Tanioka; Takahiro Kimura; Hirobumi Inoue; Hiroo Ito; Yoshihito Fukasawa, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/821,690

(22) Filed: Mar. 30, 2001

(30) Foreign Application Priority Data

Mar. 31, 2000 (JP) .......................... 2000-099574

(51) Int. Cl.[7] .......................................... H01L 23/495
(52) U.S. Cl. .......................... 257/675; 257/724; 257/48
(58) Field of Search ................................ 257/675, 724, 257/778, 48

(56) References Cited

U.S. PATENT DOCUMENTS 5,575,662 A * 11/1996 Yamamoto et al. ............ 438/67
5,872,393 A * 2/1999 Sakai et al. .................. 257/664
5,898,224 A * 4/1999 Akram ........................ 257/778
6,144,101 A * 11/2000 Akram ........................ 257/778
6,172,422 B1 * 1/2001 Chigawa et al. ............. 257/675
6,242,799 B1 * 6/2001 Horiuchi et al. ............. 257/700

FOREIGN PATENT DOCUMENTS

JP          5-206227          8/1993
JP          11-224915         8/1999

* cited by examiner

*Primary Examiner*—Hoai V. Ho
*Assistant Examiner*—Andy Huynh
(74) *Attorney, Agent, or Firm*—Whitham, Curtis & Christofferson, PC

(57) ABSTRACT

There is provided a semiconductor device tester including (a) a tester substrate having the same structure as a structure of a substrate as a product except that a semiconductor device is not mounted on the tester substrate, (b) an electrically conductive sheet covering therewith a first area in which the semiconductor device is to be mounted on the tester substrate, the electrically conductive sheet being electrically insulating in a certain direction, and (c) a holder supporting a semiconductor device to be tested therewith, and compressing the semiconductor device onto the electrically conductive sheet to thereby electrically connect an externally projecting terminal of the semiconductor device to a connection terminal mounted on the tester substrate in the first area.

14 Claims, 16 Drawing Sheets

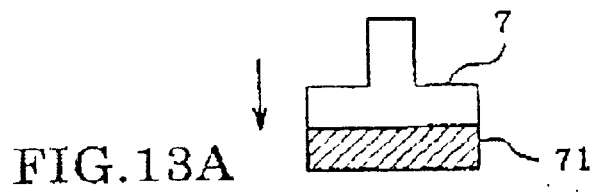
FIG.13A
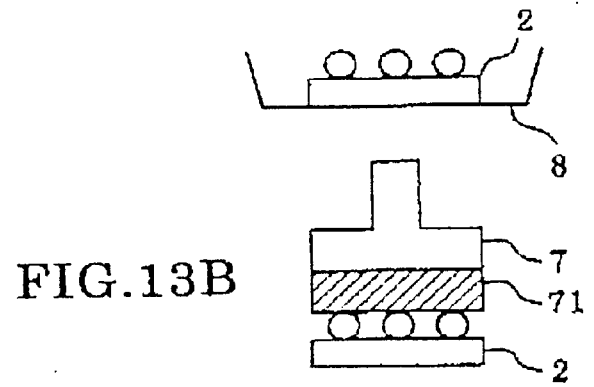
FIG.13B
FIG.13C
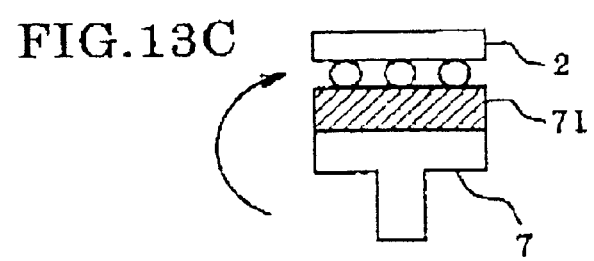
FIG.13D
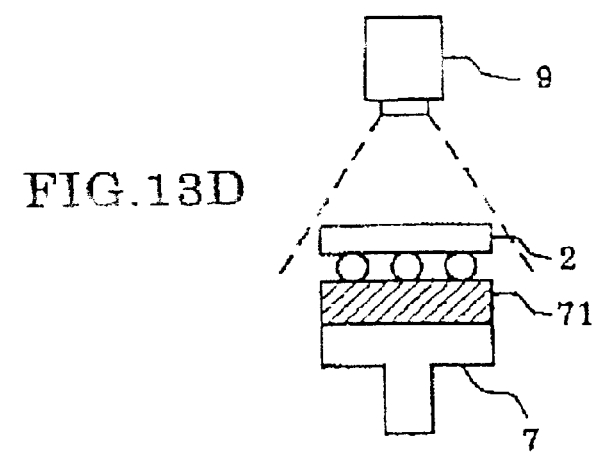
FIG.13E
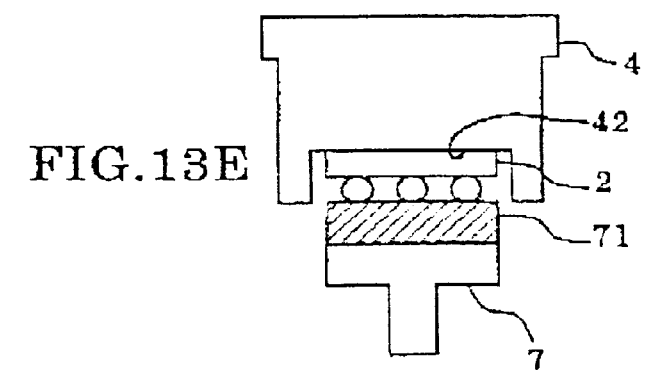

SEMICONDUCTOR DEVICE TESTER AND METHOD OF TESTING SEMICONDUCTOR DEVICE

BACKGROUND OF THE INVENTION

1. Field of the Invention

The invention relates to a tester for testing a semiconductor chip such as a bare chip or a package such as a narrow-pitched ball grid array to be mounted on a printed wiring board by face-down bonding. The invention relates further to a method of testing a semiconductor chip such as a bare chip or a package such as a narrow-pitched ball grid array to be mounted on a printed wiring board by face-down bonding.

2. Description of the Related Art

In these days, a semiconductor chip or a semiconductor package is generally mounted on a printed wiring board (PWB) by a face-down boding process which is one of wireless bonding processes.

In accordance with a face-down bonding process, since a connection terminal of a printed wiring board is positioned just below or in the vicinity of a semiconductor chip, it would be possible to mount semiconductor chips on a printed wiring board at a high density.

In addition, since a plurality of external terminals such as semiconductor chips can be bonded at a time, it would be possible to mount a plurality of semiconductor chips in a short period of time. Furthermore, since a semiconductor chip and a printed wiring board are positioned at a short distance to each other in a face-down bonding process, a face-down bonding process is suitable to a high-speed device.

As mentioned above, a face-down bonding process presents various advantages.

In general, a semiconductor chip or a semiconductor package to be mounted on a printed wiring board by a face-down bonding process is formed at a surface thereof with a plurality of externally projecting terminals at a high density. For instance, a bare chip or a ball grid array (BGA) including balls arranged at a narrow pitch is designed to include thousands of external terminals at a pitch of about 0.2 mm. It would be quite difficult to surely contact all of the external terminals to tester pins.

Hence, a test was conventionally made in order to merely guarantee a quality of a semiconductor chip, however, it was quite difficult or almost impossible to directly test a semiconductor chip as to whether a semiconductor chip could operate in a desired manner.

As a result, a semiconductor chip was tested as to whether it could operate in a desired manner, after the semiconductor chip was mounted on a printed wiring board. This test is called a card test.

FIG. 1 illustrates one of card tests, in which a bare chip mounted on a printed wiring board is tested by means of pins (hereinafter, a test as explained hereinbelow is called a pin type test).

In the pin type test, a bare chip 2 is mounted on a printed wiring board 10.

Then, electrode pins 104 are caused to stand on electrode pads 103 formed on opposite surfaces of the printed wiring board 10. Specifically, guide blocks to which the electrode pins 104 are fixed are compressed onto the printed wiring board 10 from opposite sides of the printed wiring board 10 to thereby ensure contact between the electrode pads 103 and the electrode pins 104.

Then, a test signal is input into the bare chip 2 from the electrode pins 104 through the printed wiring board 10, and subsequently, the test signal is picked out of the bare chip 2 to thereby test performances of the bare chip 2.

However, it would be quite difficult to take a semiconductor chip out of a printed wiring board after the semiconductor chip has been once mounted on the printed wiring board by a face-down bonding process. Hence, if a semiconductor chip is found defective in the pin type test, not only the semiconductor chip but also the printed wiring board on which the semiconductor chip is mounted have to be scrapped together. This results in a problem of an increase in fabrication costs of a semiconductor chip and a printed wiring board on which a semiconductor chip is mounted.

In order to solve this problem, Japanese Unexamined Patent Publication No. 5-206227 has suggested a test socket as a test tool for testing a bare chip solely.

FIG. 2 illustrates a test socket 200 suggested in the Publication.

The test socket 200 is comprised of a container 210, a cover 220 for sealing the container 210 therewith, a plurality of output pins 211 extending from an outer bottom of the container 210, connection pads 212 mounted on an inner bottom of the container 210 in alignment with bumps 201 of a bare chip 2 to be tested, and an anisotropically electrically conductive sheet 203 mounted on the connection pads 212.

The test socket 200 is mounted on a substrate under test (not illustrated) by soldering the output pins 211 onto pads mounted on the substrate under test.

The bare chip 2 is inserted into the container 210 such that the bumps 201 face the anisotropically electrically conductive sheet 203. Thereafter, the container 210 is sealed with the cover 220 to thereby compress the bare chip 2 onto the anisotropically electrically conductive sheet 203. Thus, the bumps 201 and the connection pads 212 are electrically connected to each other through the anisotropically electrically conductive sheet 203.

Thus, in accordance with the test socket 200 suggested in the above-mentioned Publication, the bare chip 2 can be tested solely before being mounted on a printed wiring board. Hereinbelow, the test carried out by means of the test socket 200 is called a socket type test.

However, the above-mentioned socket type test is carried out in a condition quite different from a condition in which a semiconductor chip is actually mounted on a printed wiring board. As a result, even if a semiconductor chip were found non-defective in the socket type test, the semiconductor chip might be judged defective in the above-mentioned card test which is carried out after a semiconductor chip has been mounted on a printed wiring board.

Thus, the socket type test is accompanied with a problem of low reliability in results of testing a semiconductor chip.

For instance, in the socket type test, a transmission line through which a test signal is input into or output from the bare chip 2 becomes unavoidably longer by a length of the pin 211. Hence, it would be impossible to test a semiconductor chip operating in a high rate with a radio-frequency signal being transmitted therefrom and received therein, with high reliability in the socket type test.

In addition, it is necessary in the socket type test to make the number and an arrangement pattern of the connection pads 212 coincide with the number and an arrangement pattern of the bumps 201 of the bare chip 2. As a result, the test socket 200 can test merely semiconductor chips having the same number and arrangement pattern. Accordingly, when various kinds of semiconductor chips are to be tested, it would be necessary to prepare test sockets associated with those semiconductor chips, resulting in an increase in fabrication costs of a printed wiring board on which those semiconductor chips are to be mounted.

Furthermore, the test socket 200 is accompanied with a problem that it is not always ensured to cause the bumps 201 and connection pads 212 to make contact with each other through the anisotropically electrically conductive sheet 203 merely by sealing the container 210 with the cover 220.

Specifically, it is generally necessary to apply a force of about $9.8 \times 10^{-2}$ N or greater per a bump to the bare chip 2 in order to ensure contact between the bumps 2 and the connection pads 212. For instance, if the test socket 200 includes 4000 bumps 2, it would be necessary to apply a force of about 392 N to the bare chip 2. It would be quite difficult or almost impossible to uniformly apply such a great force to a semiconductor chip having an area of a few square centimeters, because the container 210 is closed merely by being compressed by the cover 220 which is connected to the container 210 through a hinge.

Japanese Unexamined Patent Publication No. 11-224915 has suggested a substrate on which a semiconductor bare chip is to be mounted, including a plurality of electrodes each of which is broader than a surface of the substrate on which the semiconductor bare chip is to be mounted. The electrodes are electrically connected to electrode pads formed on the semiconductor bare chip, through electrical conductors, when the semiconductor bare chip is mounted on the substrate.

The above-mentioned problems remain unsolved even in the Publication.

SUMMARY OF THE INVENTION

In view of the above-mentioned problems in the conventional testers, it is an object of the present invention to provide a semiconductor device tester and a method of testing a semiconductor device both of which is capable of testing a semiconductor device with high reliability and reducing fabrication costs in fabricating a semiconductor device and a printed wiring board on which the semiconductor device is to be mounted.

In one aspect of the present invention, there is provided a semiconductor device tester including (a) a tester substrate having the same structure as a structure of a substrate as a product except that a semiconductor device is not mounted on the tester substrate, (b) an electrically conductive sheet covering therewith a first area in which the semiconductor device is to be mounted on the tester substrate, the electrically conductive sheet being electrically insulating in a certain direction, and (c) a holder supporting a semiconductor device to be tested therewith, and compressing the semiconductor device onto the electrically conductive sheet to thereby electrically connect an externally projecting terminal of the semiconductor device to a connection terminal mounted on the tester substrate in the first area.

In accordance with the present invention, it is possible to test a semiconductor device temporarily mounted on the tester substrate. Namely, a semiconductor device can be tested before being mounted on a printed wiring board. As a result, if a semiconductor device is found defective, only the semiconductor device is scrapped, and it is no longer necessary to scrap a printed wiring board on which the semiconductor device is to be mounted.

Accordingly, the present invention can reduce fabrication costs of a printed wiring board on which a semiconductor device is mounted.

In the present invention, a substrate as a product may be used as the tester substrate. Hence, it is not necessary to prepare a tester jig separately from a substrate as a product, regardless of specific semiconductor chips to be tested. What is necessary for reducing the present invention for practice other than the tester substrate is the electrically conductive sheet having a dimension in conformity with a dimension of a semiconductor chip to be tested.

In contrast, in the above-mentioned conventional socket type test, the tester socket can test only semiconductor chips having the same number and arrangement pattern of external terminals.

Hence, the present invention makes it possible to reduce costs for testing a semiconductor device, and accordingly, costs for fabricating a printed wiring board on which the semiconductor device is mounted, in comparison with the conventional socket type test.

Electronic components except a semiconductor chip to be tested are mounted on the tester substrate similarly to a substrate as a product. Hence, it is possible to test a semiconductor chip by inputting a test signal thereinto or receiving a test signal therefrom through the tester substrate, regardless of the number of electronic components and a pattern in which electronic components are arranged.

In contrast, in the conventional pin type test, a test signal is input into or output from the bare chip 2 through the electrode pins 104 and the electrode pads 103, as illustrated in FIG. 1. Accordingly, if the number of electronic components mounted on a printed wiring board were increased, the electrode pins 104 had to be increased in number accordingly, even if the bare chip 2 remains the same. This results in an increase in costs for carrying out the test.

In comparison with the pin type test, the present invention makes it possible to reduce testing costs, and accordingly, fabrication costs of a printed wiring board.

In accordance with the present invention, a semiconductor device is temporarily mounted on the tester substrate on which electronic components except a semiconductor chip are mounted, and then, tested. Hence, a semiconductor device can be tested in the same condition as a condition in which a semiconductor device is actually mounted on a printed wiring board as a product. Accordingly, a semiconductor device can be tested with high reliability.

In the present invention, since what is inserted between a semiconductor device to be tested and the tester substrate is the electrically conductive sheet only, it would be possible to shorten a length of a transmission line through which a test signal is transmitted between a semiconductor chip and the tester substrate, in comparison with the same in the above-mentioned socket type test. Accordingly, the present invention makes it possible to test a semiconductor chip transmitting and receiving radio-frequency signals for high-rate operation, with high reliability.

In addition, in accordance with the present invention, a semiconductor device can be tested before being mounted on a printed wiring board. Hence, in fabrication of a printed wiring board, it is possible to carry out in parallel a step of testing a semiconductor device and a step of mounting electronic components on a printed wiring board, ensuring an increase in an efficiency of fabricating a printed wiring board.

It may be considered that a semiconductor device is temporarily mounted on the tester substrate without the electrically conductive sheet being sandwiched therebetween. However, a semiconductor chip or a package of BGA has a curvature, and there is non-uniformity in a height of externally projecting terminals of a semiconductor chip. Similarly, the tester substrate has a curvature, and there is non-uniformity in a height of connection terminals of the tester substrate.

Hence, it would be quite difficult to cause all of externally projecting terminals of a semiconductor chip to surely make direct contact with connection terminals of the tester substrate at the same time.

Even if all of the externally projecting terminals of a semiconductor chip could be caused to make contact with the connection terminals of the tester substrate by compressing the semiconductor chip onto the tester substrate under a high pressure, in order to absorb the above-mentioned curvature and non-uniformity, there is high possibility that both the externally projecting terminals and the connection terminals might be damaged. In particular, the connection terminals of the tester substrate are likely to be deformed or broken.

If the connection terminals were damaged, the tester substrate has to be replaced with a new one. If the externally projecting terminals of a semiconductor chip were damaged, the semiconductor chip might be unable to be properly recognized when mounted on a printed wiring board.

For instance, the electrically conductive sheet may be comprised of an insulating resin film, and electrical conductors in the form of a line. The electrical conductors extend through the insulating resin film in a thickness-wise direction of the insulating resin film at a first pitch equal to or smaller than a second pitch at which externally projecting terminals of the semiconductor device are arranged.

In accordance with the above-mentioned electrically conductive sheet, the insulating resin film having flexibility absorbs non-uniformity in a height of the externally projecting terminals and the connection terminals, and the electrical conductors ensure electrical connection between the externally projecting terminals and the connection terminals. Thus, it would be possible to surely electrically connect all of the externally projecting terminals to all of the connection terminals at a time.

In addition, the electrically conductive sheet can be cut into a desired shape in conformity with a shape and/or a dimension of a semiconductor device to be tested or the first area. Hence, the electrically conductive sheet having a desired dimension can be readily prepared regardless of a shape and/or a dimension of a semiconductor device.

It is preferable that the electrical conductors are inclined relative to a normal line of the electrically conductive sheet.

It is preferable that the electrical conductors are inclined relative to a normal line of the electrically conductive sheet by an angle in the range of 10 to 45 degrees both inclusive.

It is preferable that the electrical conductors are S-shaped.

It is preferable that the electrical conductors extend through the insulating resin film vertically to a surface of the electrically conductive sheet.

It is preferable that the electrical conductors are bent such that an end of each of the electrical conductors is in alignment with the other end of each of the electrical conductors at opposite surfaces of the electrically conductive sheet.

It is preferable that the electrical conductors are composed of elastic material.

As an alternative, the electrically conductive sheet may be comprised of an insulating film formed with through-holes in the same pattern as a pattern in which externally projecting terminals of the semiconductor device are arranged, and electrical conductors filling the through-holes therewith such that the electrical conductors project at opposite sides of the insulating film.

The above-mentioned electrically conductive sheet makes it possible to arrange the electrical conductors in the same pattern as a pattern in which the externally projecting terminals are arranged. Since the electrical conductors make contact with the externally projecting terminals, the externally projecting terminals would be less damaged than the externally projecting terminals making contact with the above-mentioned electrical conductors in the form of a line.

In addition, the electrically conductive sheet shortens a distance between a semiconductor device under test and the tester substrate. Hence, the electrically conductive sheet is in particular suitable for testing a semiconductor chip having a high operation speed.

The electrical conductors may be composed preferably of elastic material such as electrically conductive resin, ensuring electrical connection between a semiconductor chip under test and the tester substrate.

A plurality of externally projecting terminals is mounted on a face of a semiconductor chip to be mounted on a printed wiring board by face-down bonding. Hence, in order to ensure the externally projecting terminals to make contact with the connection terminals, it would be necessary to compress a semiconductor chip onto the electrically conductive sheet with a great force to some degree.

On the other hand, it is also necessary to minimize damage to be exerted on externally projecting terminals of a semiconductor chip or a package of BGA, in order not to exert a harmfully influence on a next step, that is, a step of mounting a semiconductor chip on a substrate.

A side surface of a bare chip or BGA is not perfectly perpendicular to a face, and generally has irregularities. In addition, a bare chip or BGA is quite thin. Accordingly, it would be quite difficult to mechanically hold a bare chip at its side surfaces, and then, compress the bare chip onto the tester substrate with a sufficiently great force.

Thus, the holder may be designed to include an adsorption surface at which a surface opposite to a surface on which the externally projecting terminal is mounted is adsorbed, at least one hole formed in the adsorption surface, the semiconductor device being adsorbed to the holder at the adsorption surface by sucking the semiconductor device through the hole.

By holding a semiconductor chip by means of the holder, it is possible to surely hold a semiconductor chip with a minimum stress being applied thereto, and compress the semiconductor chip onto the electrically conductive sheet with a force as great as possible.

When the electrically conductive sheet is deformed by being compressed by a semiconductor device, a portion of the electrically conductive sheet located around a compressed portion displaces towards a non-compressed portion. As a result, the electrical conductor located in the portion makes slide movement, resulting in insufficient contact between the electrically conductive sheet and an outermost externally projecting terminal among the externally projecting terminals.

To avoid this problem, the holder may be designed to include a wall standing around the adsorption surface, the wall having a height equal to a sum of a thickness of the semiconductor device and a thickness of the externally projecting terminal.

When a semiconductor device is compressed onto the electrically conductive sheet, a portion around a portion making contact with the externally projecting terminals of a semiconductor device is also compressed by the wall. Hence, it is possible to prevent the electrical conductor from making slide movement around an outermost externally projecting terminal among the externally projecting terminals, ensuring electrical connection between the outermost externally projecting terminal and the associated connection terminal.

The semiconductor device tester may be designed to further include (d) a detector which detects alignment marks of both the tester substrate and the semiconductor device and transmits a detection signal indicative of results of the detection, and (e) a mover which moves the holder relative to the tester substrate in accordance with the detection signal.

It is preferable that the tester substrate includes a frame formed thereon for inserting the electrically conductive sheet thereinto.

It is preferable that the frame is formed with a recess in a horizontal plane, the electrically conductive sheet being inserted at an outer edge thereof into the recess.

In another aspect of the present invention, there is provided a method of testing a semiconductor device, comprising the steps of (a) positioning an electrically conductive sheet above a first area in which a semiconductor device to be tested is to be mounted on a tester substrate having the same structure as a structure of a substrate as a product except that a semiconductor device is not mounted on the tester substrate, the electrically conductive sheet being electrically insulating in a certain direction, (b) compressing the semiconductor device onto the electrically conductive sheet to thereby electrically connect an externally projecting terminal of the semiconductor device to a connection terminal mounted on the tester substrate in the first area, (c) inputting a test signal into the semiconductor device through the tester substrate and receiving the test signal from the semiconductor device through the tester substrate, and (d) judging whether the semiconductor device is non-defective or defective in accordance with results of the step (c).

For instance, the step (b) may include the steps of (b1) sucking the semiconductor device at a surface opposite to a surface on which the externally projecting terminal is mounted, onto an adsorption surface of a holder, and (b2) moving the holder towards the electrically conductive sheet.

It is preferable that the holder includes a wall standing around the adsorption surface, the wall having a height equal to a sum of a thickness of the semiconductor device and a thickness of the externally projecting terminal, the wall also compressing the semiconductor device onto the electrically conductive sheet in the step (b).

The method may further include the steps of (e) detecting alignment marks of both the tester substrate and the semiconductor device, and (f) correcting a position of the semiconductor chip in accordance with results of the detection carried out in the step (a).

The method may further include the steps of (e) detecting alignment marks of both the tester substrate and the semiconductor device, and (f) correcting a position of the holder in accordance with results of the detection carried out in the step (a).

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 13A to 13E illustrate steps of holding a bare chip.

DESCRIPTION OF THE PREFERRED EMBODIMENTS

Preferred embodiments in accordance with the present invention will be explained hereinbelow with reference to drawings.

Figure 3:
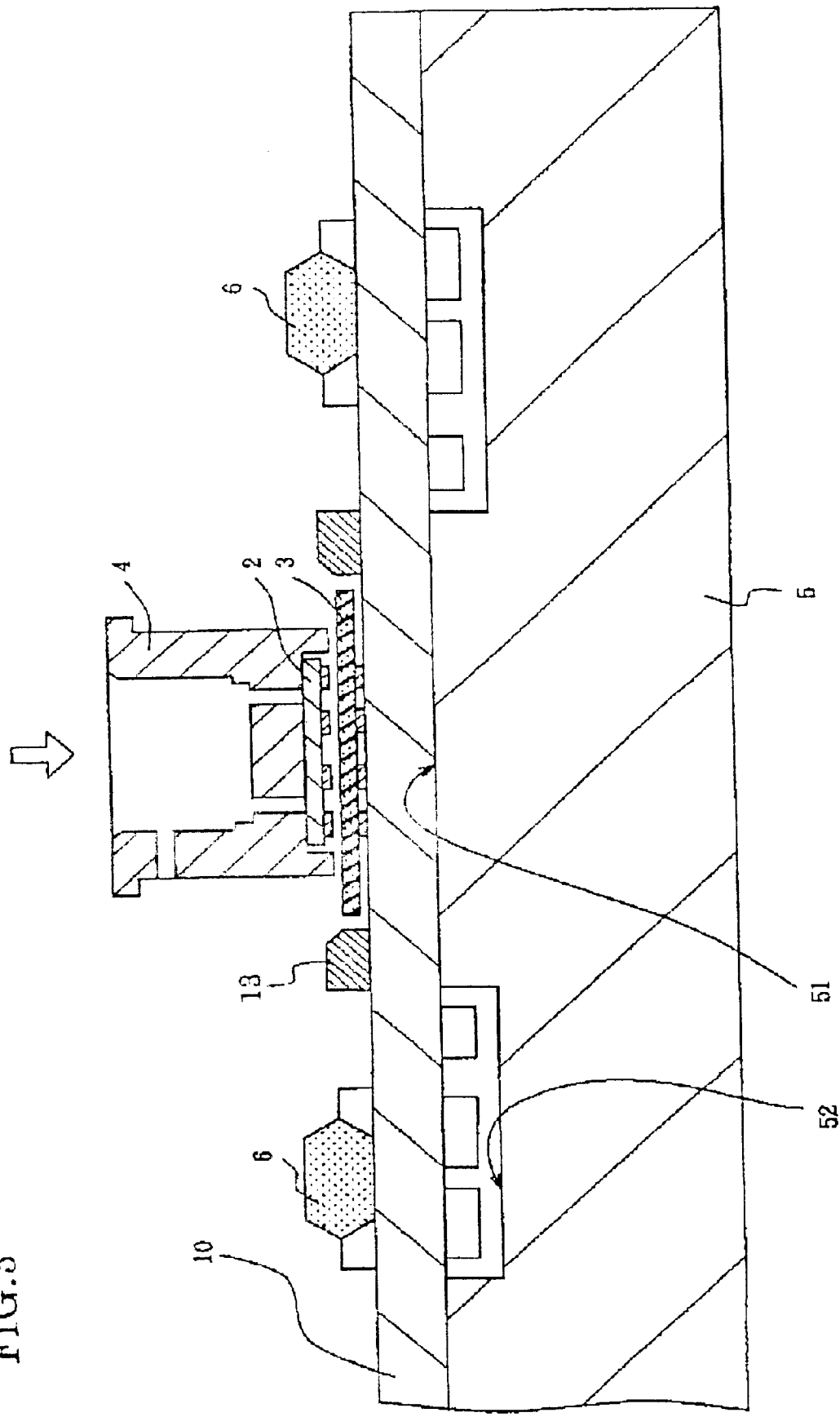
FIG. 3 is a cross-sectional view of a semiconductor device tester in accordance with an embodiment of the present invention.

FIG. 3 illustrates a semiconductor chip tester in accordance with an embodiment of the present invention.

As illustrated in FIG. 3, a semiconductor chip tester in accordance with the embodiment is comprised of a testing board 1 as the tester substrate, a contact sheet 3 as the electrically conductive sheet, and a collet 4 as the holder.

The testing board 1 is comprised of a printed wiring board 10, electronic components 6 mounted on the printed wiring board 10, a frame 13 defining therein a mount area 11 in which a bare chip is to be mounted, connection pads 12 (see FIG. 5) arranged in the mount area 11, terminals 15 (see FIG. 4) through which the testing board 1 is electrically connected to an external device, and alignment marks 14 (see FIG. 4) formed on an upper surface of the printed wiring board 10.

The testing board 1 is fixed on an upper surface 51 of a stage 5 through a bolt (not illustrated). The stage 5 is formed at the upper surface 51 thereof with recesses 52 in which electronic components mounted on a lower surface of the testing board 1 are accommodated.

Figure 4:
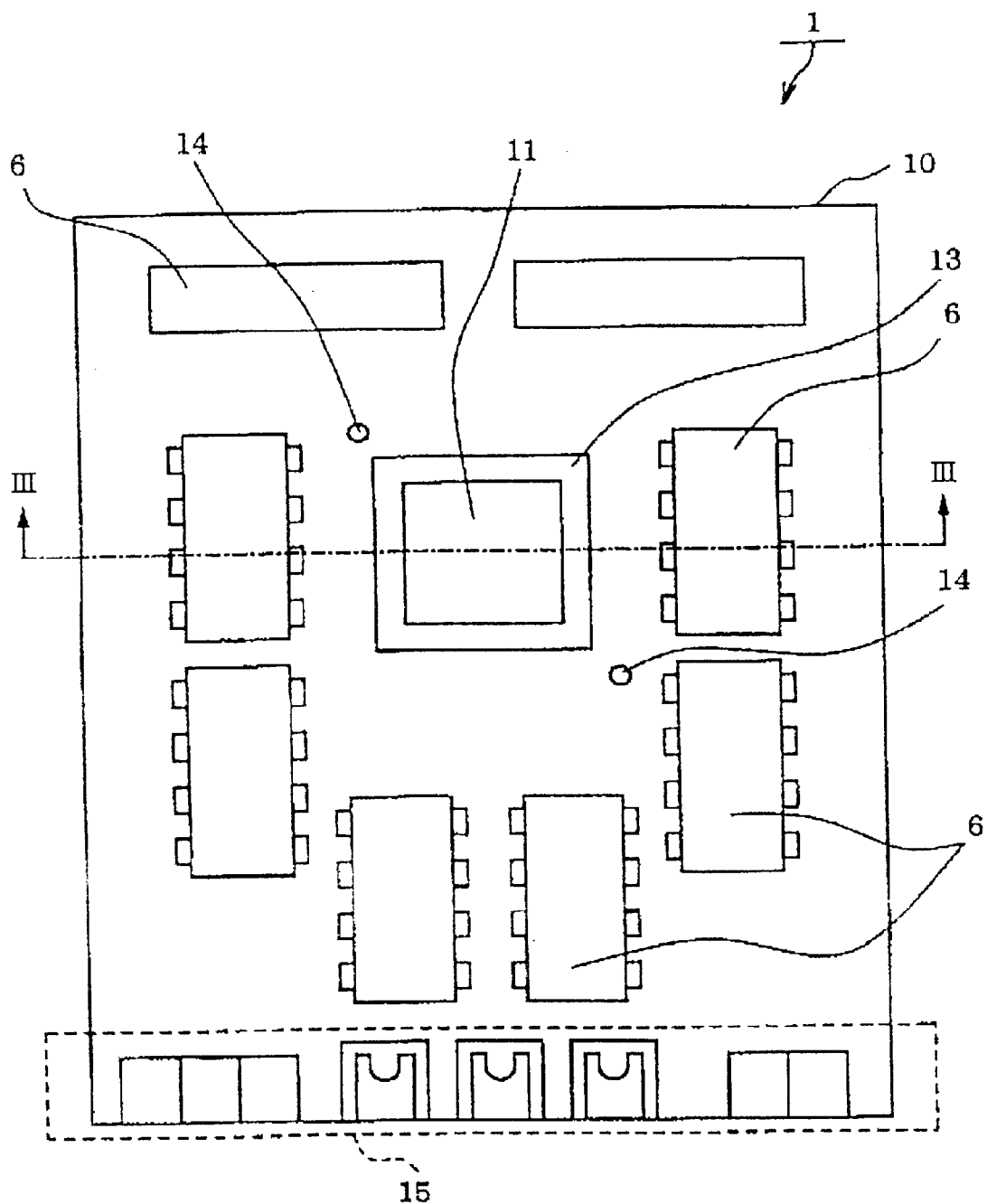
FIG. 4 is a plan view of the tester substrate which is a component of a semiconductor device tester in accordance with an embodiment of the present invention.

FIG. 4 is a plan view of the testing board 1. FIG. 3 is a cross-sectional view taken along the line III—III in FIG. 4. In FIG. 4, the connection pads 12 arranged in the mount area 11 are omitted for simplicity.

As illustrated in FIG. 4, the testing board 1 has the same structure as a structure of a substrate as a product except that a bare chip 2 is not mounted in the mount area 11. That is, a substrate as an intermediate product, comprising the printed wiring board 10 on which the electronic components 6 except the bare chip 2 are mounted, is used as the testing board 1

Hence, the number and a pattern of the connection pads 12 mounted on the testing board 1 are the same as those of the electrode pads 21 of the bare chip 2 to be mounted on a substrate as a product. Accordingly, it is not necessary to prepare a tester jig separately from a substrate as a product, regardless of a dimension of the bare chip 2. What is to be prepared other than the testing board 1 is the contact sheet 3 having a size in conformity with a dimension of the bare chip 2.

Hence, the embodiment makes it possible to reduce costs for testing the bare chip 2, and accordingly, costs for fabricating a printed wiring board on which the bare chip 2 is mounted, in comparison with the conventional socket type test.

The electronic components 6 except the bare chip 2 to be tested are mounted on the testing board 1 similarly to a substrate as a product. Hence, it is possible to test the bare chip 2 by inputting a test signal thereinto or receiving a test signal therefrom through the external terminals 15 of the testing board 1, regardless of both the number of the electronic components 6 and a pattern in which the electronic components 6 are arranged.

Figure 1:
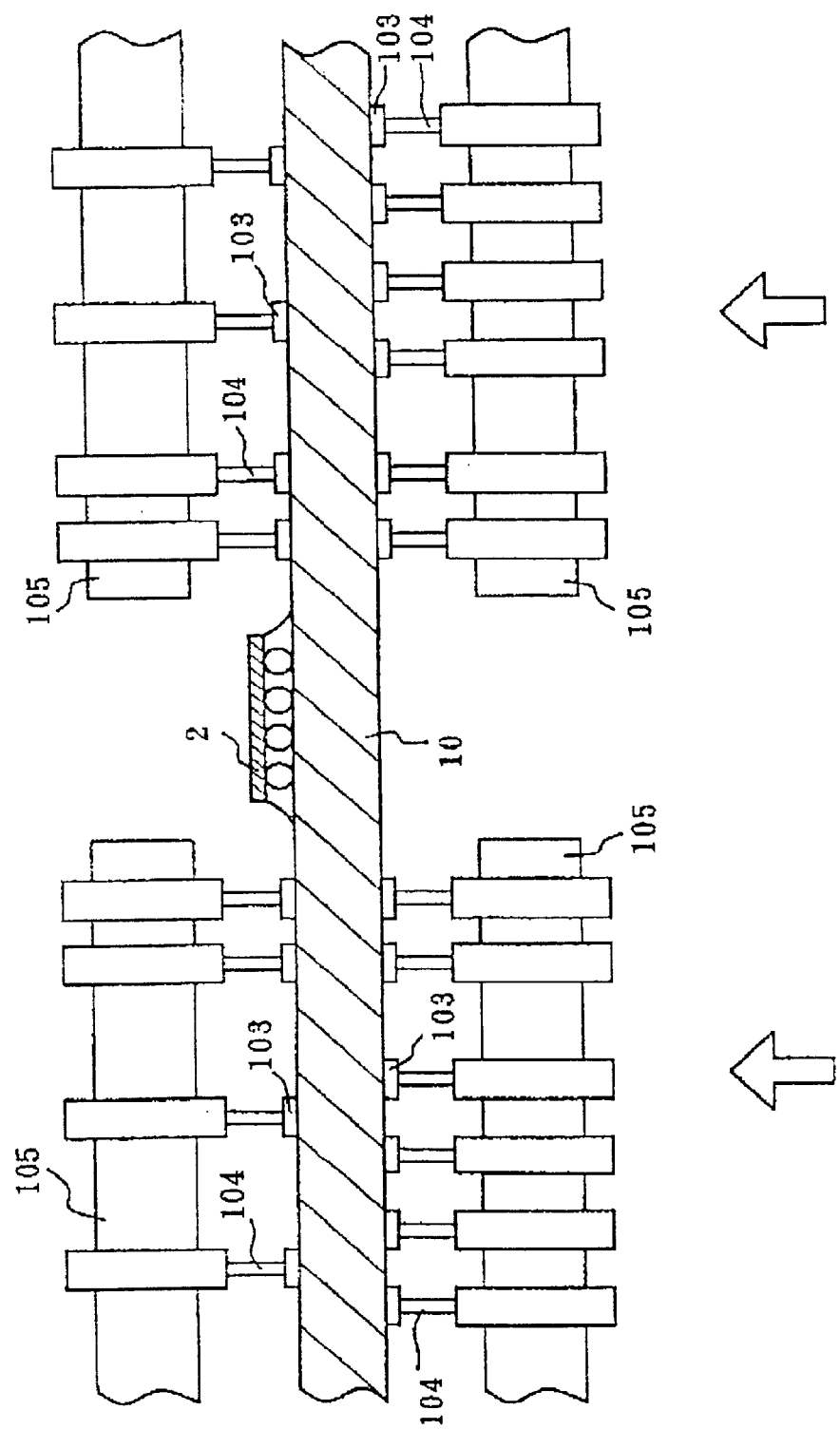
FIG. 1 is a cross-sectional view of a semiconductor chip to be tested by the conventional pin type test.
Figure 2:
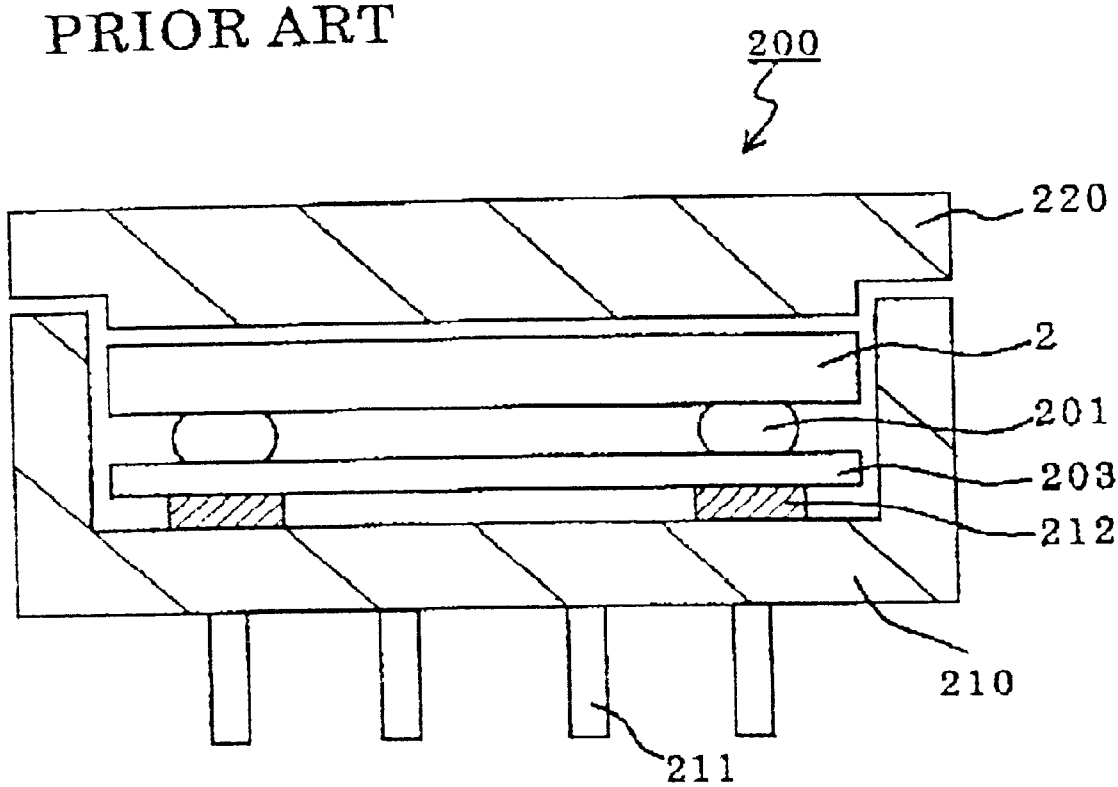
FIG. 2 is a cross-sectional view of a tester socket used in the conventional socket type test.

In contrast, in the conventional pin type test, a test signal is input into or output from the bare chip 2 through the electrode pins 104 and the electrode pads 103, as illustrated in FIG. 1. Accordingly, if the number of electronic components mounted on a printed wiring board were increased, the electrode pins 104 had to be increased in number accordingly, even if the bare chip 2 remains the same. This results in an increase in costs for carrying out the test.

In comparison with the pin type test wherein if components to be mounted on a printed wiring board are increased in number, the electrode pins are unavoidably increased in number, resulting in an increase in testing costs, the embodiment makes it possible to reduce testing costs, and accordingly, fabrication costs of a printed wiring board.

Figure 5:
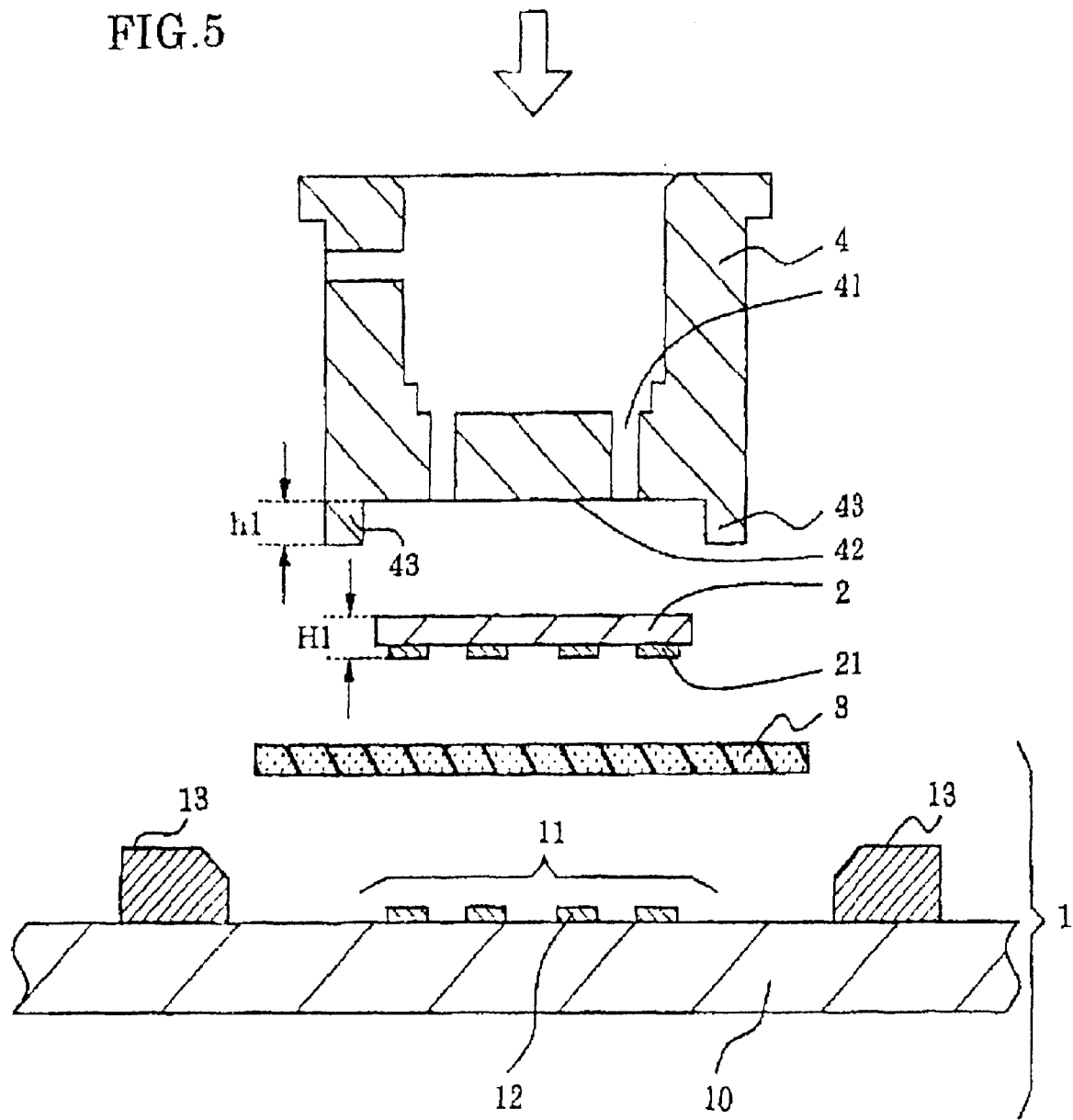
FIG. 5 is an enlarged cross-sectional view of a semiconductor device tester in accordance with an embodiment of the present invention.

FIG. 5 is an enlarged view of the collet 4, the bare chip 2, the electrically conductive sheet 3, and the mount area 11 of the testing board 1. In FIG. 5, the components are vertically separated from one another for the purpose of better understanding of the structure of the semiconductor chip tester in accordance with the embodiment.

As illustrated in FIG. 5, the contact sheet 3 is laid on the connection pads 12 in the mount area 11 of the testing board 1. The mount area 11 is defined or surrounded by the square-shaped frame 13 (see FIG. 4) in order to prevent the contact sheet 3 from being deviated.

FIGS. 6A to 6C and 7A to 7C illustrate examples of the contact sheet 3.

Figure 6A:
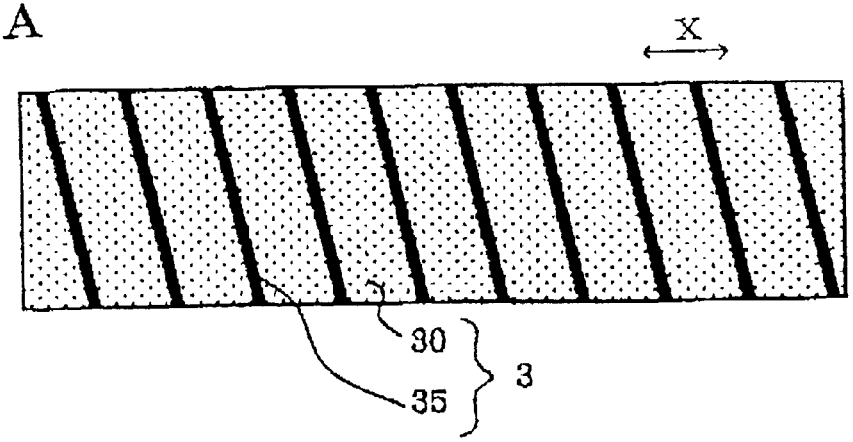
FIG. 6A is a cross-sectional view of a first example of an electrically conductive sheet.

FIG. 6A is a cross-sectional view of a first example of the contact sheet 3.

The contact sheet 3 in accordance with the first example is comprised of an electrically insulating resin film 30, and electrical conductors 35 composed of metal wires. The electrical conductors 35 extend through the electrically insulating resin film 30 in a thickness-wise direction at a pitch equal to or smaller than a pitch at which the electrode pads 21 are arranged.

In the first example, the electrically insulating resin film 30 is composed of silicone rubber having a thickness in the range of 1 to 2 mm. The electrical conductors 35 are comprised of metal wires having a diameter of 23 micrometers or smaller and composed of BeCu or W The electrical conductors or metal wires 35 are randomly arranged at a pitch in the range of 30 to 50 micrometers in a planar pattern. Thus, the contact sheet 3 is electrically insulating in a direction in which the metal wires 35 are spaced away from one another, that is, in a direction indicated with an arrow X.

It should be noted that the electrically insulating resin film 30 and the metal wires 35 may be composed of any materials other than the above-mentioned ones.

The metal wires 35 are inclined by an angle in the range of 10 to 45 degrees both inclusive relative to a normal line of the contact sheet 3. The inclination of the metal wires 35 ensures elasticity and durability in a thickness-wise direction of the contact sheet 3. When the bare chip 2 is temporarily mounted on the testing board 1 through the contact sheet 3, the bare chip 2 is horizontally offset in accordance with a direction and an angle of the inclination of the metal wires 35 for aligning with the contact sheet 3.

Figure 6B:
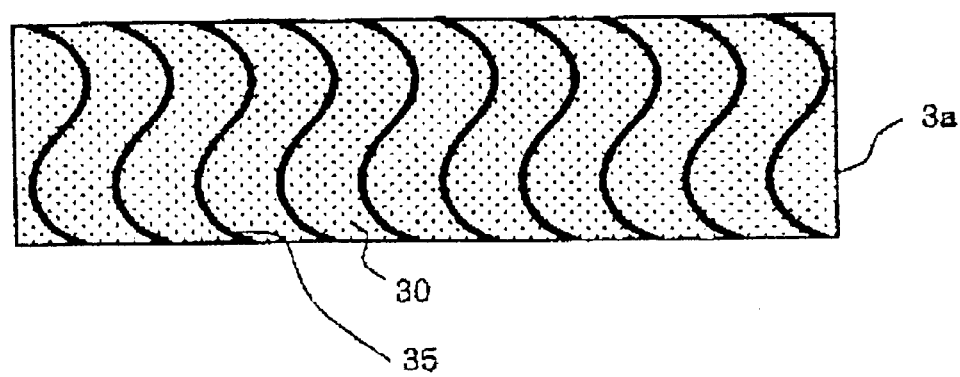
FIG. 6B is a cross-sectional view of a second example of an electrically conductive sheet.

FIG. 6B is a cross-sectional view of a second example of the contact sheet 3.

The contact sheet 3a in accordance with the second example is comprised of an electrically insulating resin film 30, and electrical conductors 35 composed of S-shaped metal wires. The electrical conductors 35 extend through the electrically insulating resin film 30 in a thickness-wise direction. The curved metal wires 35 ensure elasticity and durability in a thickness-wise direction of the contact sheet 3a, even if the metal wires 35 are not inclined.

Figure 6C:
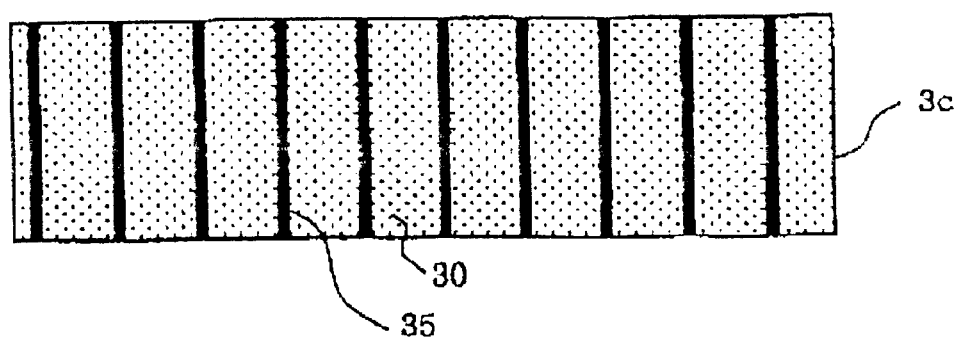
FIG. 6C is a cross-sectional view of a third example of an electrically conductive sheet.

FIG. 6C is a cross-sectional view of a third example of the contact sheet 3.

The contact sheet 3c in accordance with the third example is comprised of an electrically insulating resin film 30, and electrical conductors 35 composed of metal wires extending vertically through the electrically insulating resin film 30 in a thickness-wise direction. The vertically extending metal wires 35 makes it no longer necessary to offset the bare chip 2 when the bare chip 2 is mounted onto the testing board 1.

The metal wires 35 may be curved in a shape "□".

The contact sheet 3, 3a or 3c may be readily cut in a desired shape and dimension in accordance with a shape and a dimension of the mount area 11. Hence, a contact sheet having a desired dimension can be readily prepared, regardless of a size of the bare chip 2.

Figure 7A:
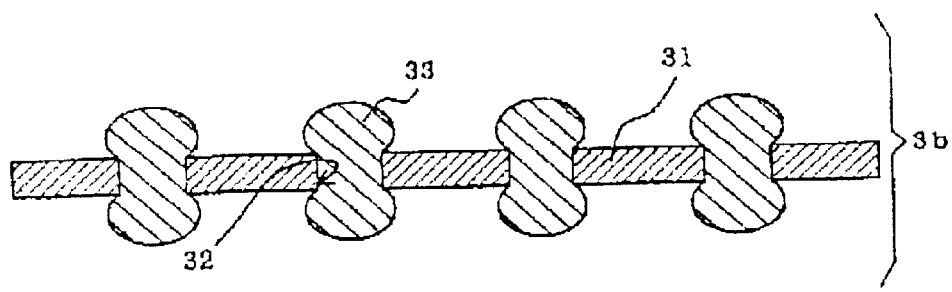
FIG. 7A is a cross-sectional view of a fourth example of an electrically conductive sheet.

FIG. 7A is a cross-sectional view of a fourth example of the contact sheet 3.

The contact sheet 3b in accordance with the fourth example is comprised of an electrically insulating film 31, and electrical conductors 33 extending throughout and projecting from the electrically insulating film 31.

The electrically insulating film 31 is comprised of a membrane sheet composed of polyimide and having a thickness in the range of 12.5 to 25 micrometers both inclusive. The electrically insulating film 31 is formed with openings 32 in the same pattern as a pattern in which the electrode pads 21 are arranged. The electrical conductors 33 extend through the openings 32, and project from the electrically insulating film 31 at upper and lower surfaces by tens of micrometers. That is, the contact sheet 3b has a thickness of about 0.1 mm at greatest.

In accordance with the contact sheet 3b, it would be possible to shorten a distance between the bare chip 2 and the testing board 1. The contact sheet 3b is suitable in particular to testing of a semiconductor chip operating at a high speed.

The electrical conductors 33 are composed preferably of elastic material such as electrically conductive resin. Such electrical conductors 33 ensure close contact between the bare chip 2 and the testing board 1.

Figure 7B:
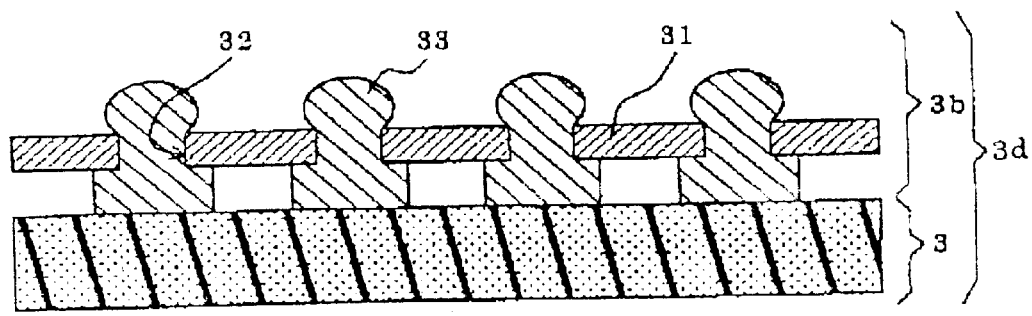
FIG. 7B is a cross-sectional view of a fifth example of an electrically conductive sheet.

FIG. 7B is a cross-sectional view of a fifth example of the contact sheet 3.

The contact sheet 3d in accordance with the fifth example is comprised of a first electrically insulating resin film 30, first electrical conductors 35 composed of metal wires and extending throughout the first electrically insulating film 30 in a thickness-wise direction, a second electrically insulating film 31, and second electrical conductors 33 extending throughout and projecting from the second electrically insulating film 31.

That is, the contact sheet 3d is comprised of the contact sheet 3 illustrated in FIG. 6A, and the contact sheet 3b illustrated in FIG. 7A, mounted on the contact sheet 3.

The contact sheet 3d reduces damage to be exerted on the electrode pads 21 of the bare chip 2. In addition, if solder is adhered to the contact sheet 3b, only the contact sheet 3b may be scrapped.

Though the contact sheet 3 may be laid on the contact sheet 3b, it is preferable that the contact sheet 3b is laid on the contact sheet 3 such that the contact sheet 3 faces the testing board 1. By arranging the contact sheet 3 to face the testing board 1, less damage would be exerted on the connection pads 21 of the bare chip 2.

Figure 7C:
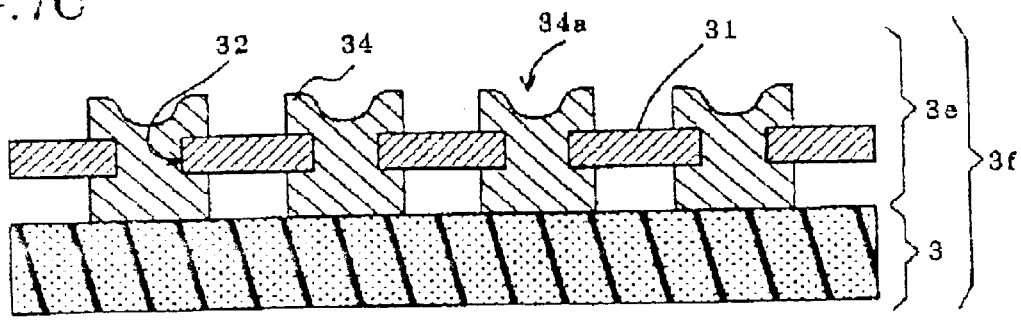
FIG. 7C is a cross-sectional view of a sixth example of an electrically conductive sheet.

FIG. 7C is a cross-sectional view of a sixth example of the contact sheet 3.

The contact sheet 3f in accordance with the sixth example is comprised of a first electrically insulating resin film 30, first electrical conductors 35 composed of metal wires and extending throughout the first electrically insulating film 30 in a thickness-wise direction, a second electrically insulating film 31, and an electrically conductive pattern 34 extending throughout and projecting from the second electrically insulating film 31.

That is, the contact sheet 3f is comprised of the contact sheet 3 illustrated in FIG. 6A, and a contact sheet 3e comprised of the second electrically insulating film 31 and the electrically conductive pattern 34, mounted on the contact sheet 3.

That is, the contact sheet 3f in accordance with the sixth example has the same structure as the structure of the contact sheet 3d except the second electrical conductors 33 are replaced with the electrically conductive pattern 34. The electrically conductive pattern 34 is formed at a summit thereof with a recess 34a reflecting a shape of the opening 32.

By forming the electrically conductive pattern 34, it is not necessary to form the second electrical conductors or bumps 33, ensuring reduction in fabrication costs of the contact sheet.

In addition, since the connection pads 21 of the bare chip 2 could be inserted into the recesses 34a when the bare chip 2 is temporarily mounted on the testing board 1, the bare chip 2 could be readily positioned relative to the testing board 1.

It should be noted that the contact sheet 3e may be used solely.

The bare chip 2 is temporarily mounted onto the testing board 1 through the contact sheet 3, 3a, 3c, 3b, 3d, 3f or 3e. The contact sheets, 3a, 3c, 3b, 3d, 3f and 3e absorb non-uniformity in a height of the electrode pads 21 and the connection pads 21, and ensure electrical contact between all of the electrode pads 21 and all of the connection pads 12.

In addition, the contact sheet 3, 3a, 3c, 3b, 3d, 3f or 3e enables the electrode pads 21 and the connection pads 12 to make contact with each other by a shorter distance than the conventional pin type test, and hence, the bare chip 2 could be tested more rapidly.

Figure 9A:
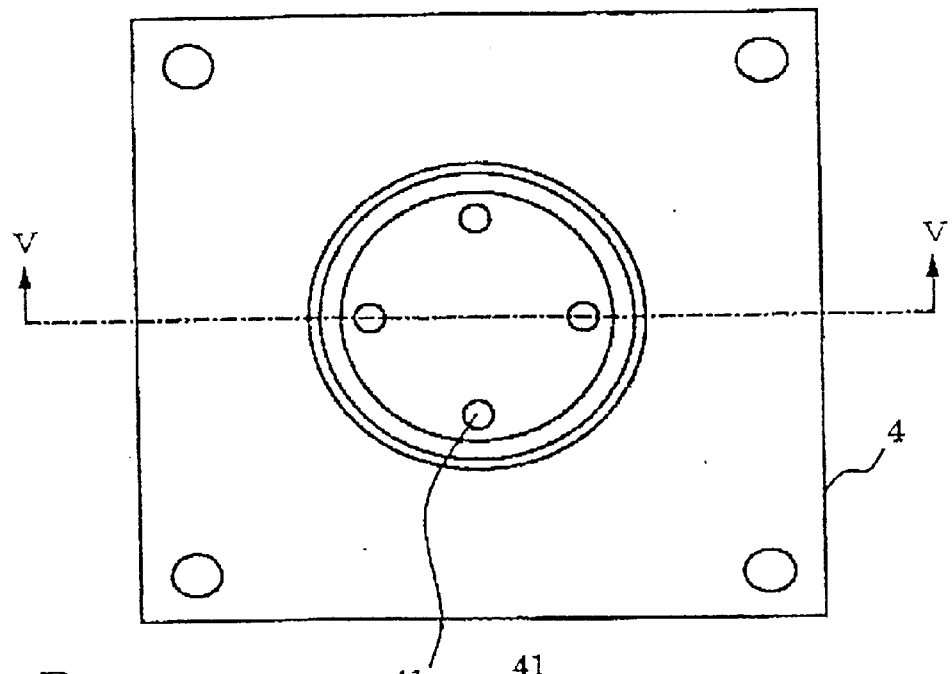
FIG. 9A is a plan view of a collet.
Figure 9B:
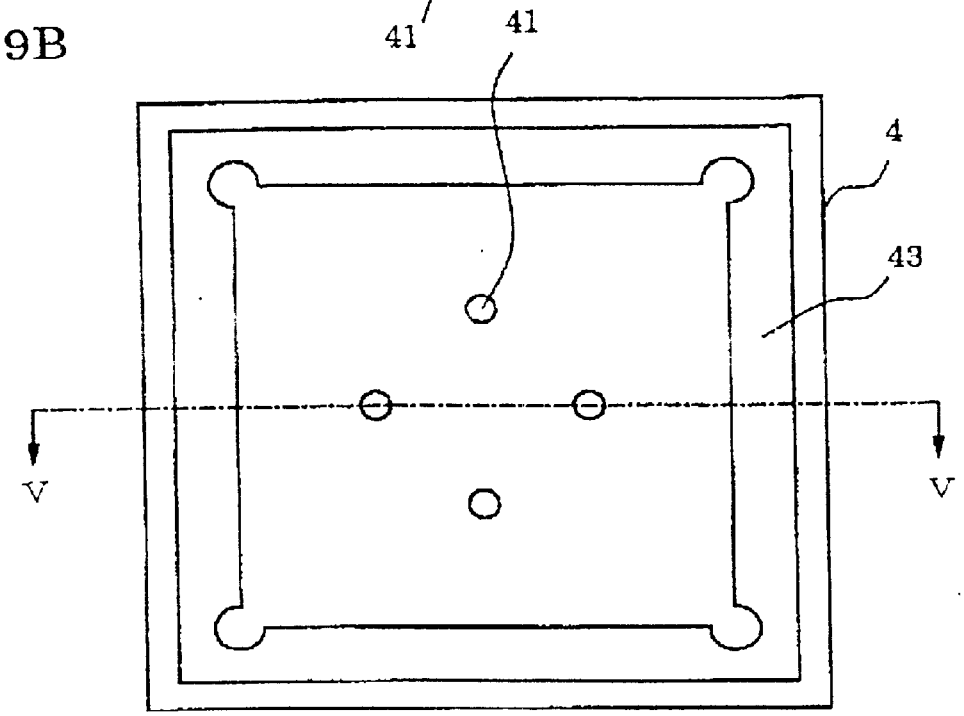
FIG. 9B is a bottom view of a collet.

Hereinbelow is explained a structure of the collet 4 with reference to FIGS. 5, 9A and 9B. FIG. 9A is a top view of the collet 4, FIG. 9B is a bottom view of the collet 4, and FIG. 5 illustrates the collet 4 in a cross-section taken along the lines V—V in FIGS. 9A and 9B.

The collet 4 is a jig to hold the bare chip 2 therewith, and compresses the bare chip 2 onto the contact sheet 3 to thereby temporarily mount the bare chip 2 onto the testing board 1. In order to accomplish such functions, the collet 4 is designed to include an adsorption surface 42 to which a back surface of the bare chip 2 is adsorbed. As illustrated in FIG. 9B, the adsorption surface 42 is formed with four adsorption holes 41.

The adsorption surface 42 is broader in size than the bare chip 2 by about 0.1 mm.

By adsorbing the bare chip 2 by means of the collet 4, it would be possible to hold the bare chip 2, and compress the bare chip 2 onto the contact sheet 3 with a force of about hundreds of N, without damaging the bare chip 2.

The collet 4 is designed to further include a wall 43 standing around the adsorption surface 42, as illustrated in FIG. 9B. As illustrated in FIG. 5, the wall 43 is designed to have a height h1 equal to a height H1 from a back surface of the bare chip 2 to a summit of the electrode pad 21.

In the embodiment, the wall 43 has a height h1 of about 1 mm, and a thickness of about 0.4 mm.

Figure 8:
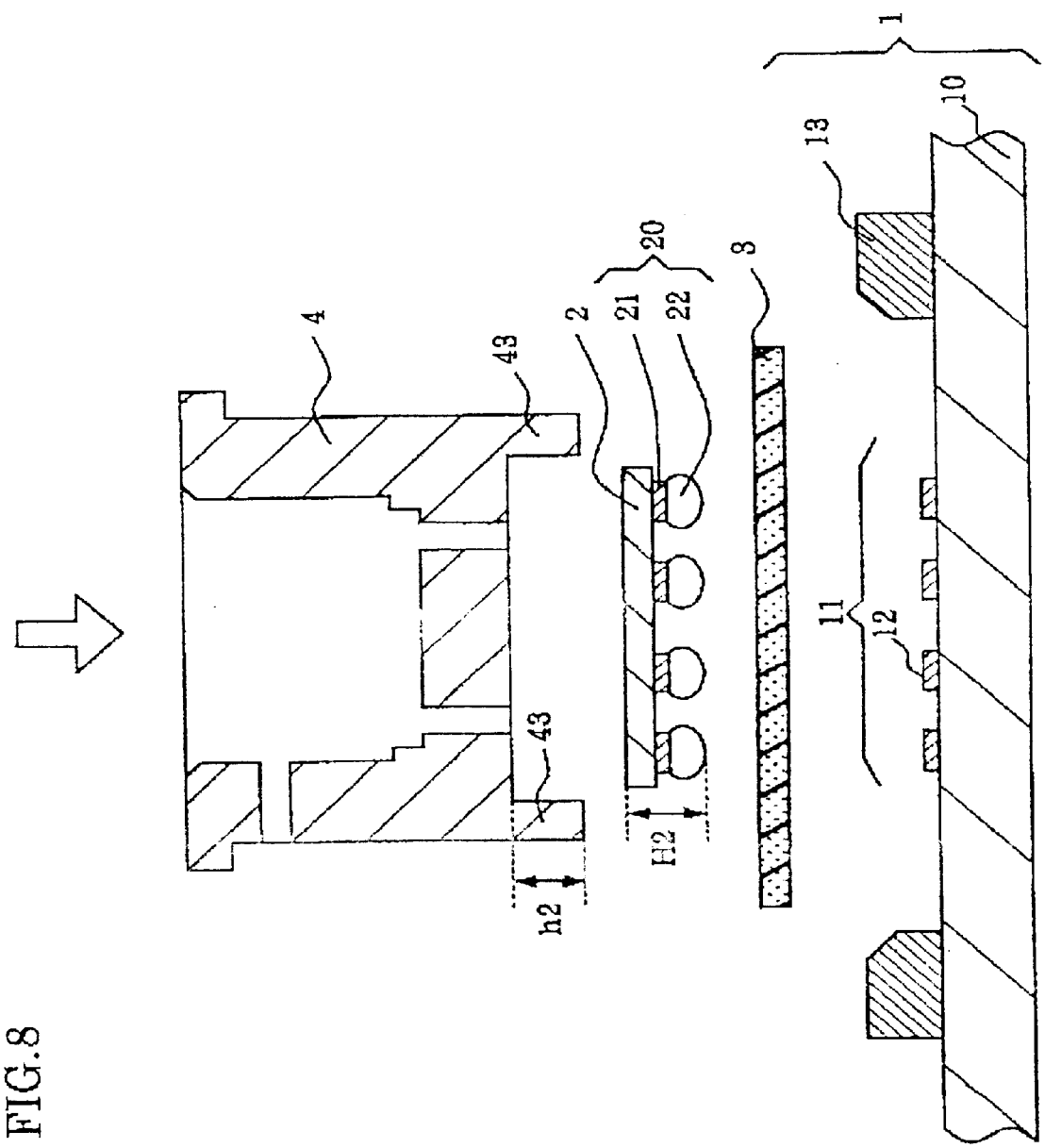
FIG. 8 is a cross-sectional view of a semiconductor device tester in accordance with an embodiment of the present invention, illustrating another semiconductor device being tested by the semiconductor device tester.

As illustrated in FIG. 8, solder bumps 22 may be formed on the electrode pads 21, in which case, both the electrode pads 21 and the solder bumps 22 constitute the externally projecting terminals 20. In the case, the wall 43 is designed to have a height h2 equal to a height H2 from a back surface of the bare chip 2 to a summit of the bump 22.

Hereinbelow is explained the advantages obtained by the wall 43, with reference to FIGS. 10A and 10B.

Figure 10A:
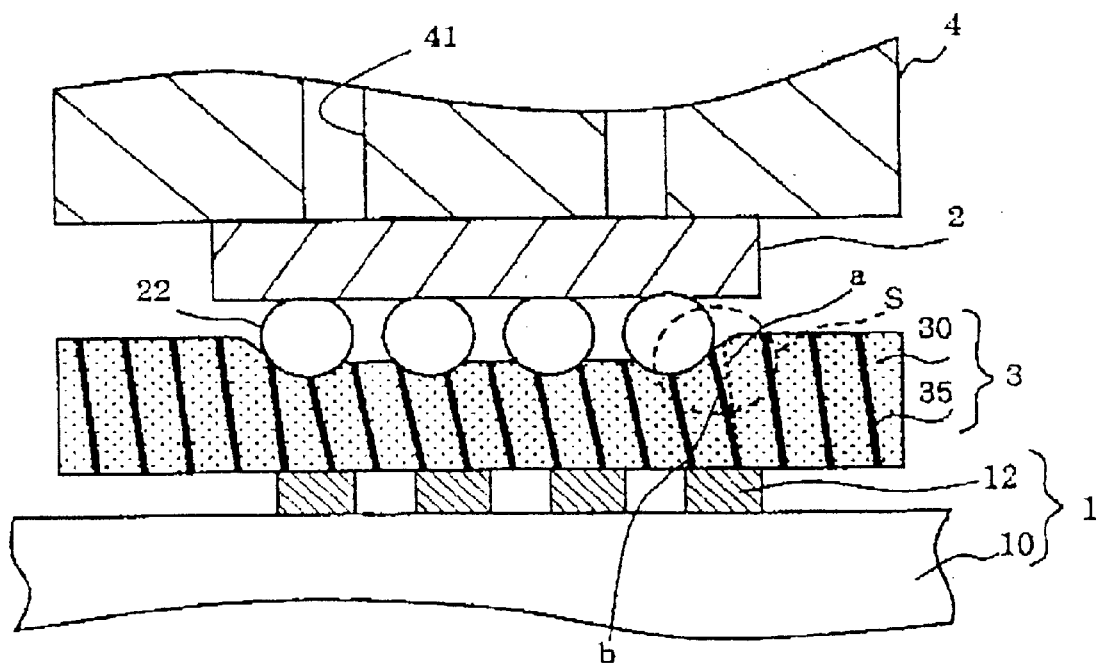
FIG. 10A is a cross-sectional view of the electrically conductive sheet and a collet without a wall.
Figure 10B:
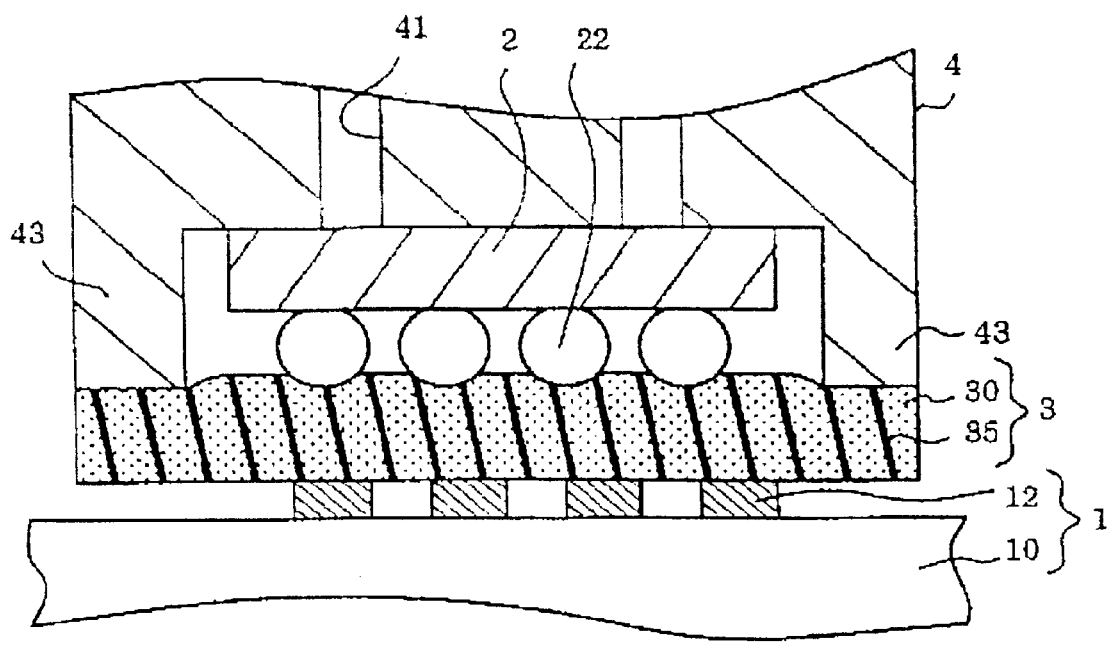
FIG. 10B is a cross-sectional view of the electrically conductive sheet and a collet with a wall.

FIG. 10A is a cross-sectional view of the contact sheet 3 and the collet 4 without the wall 43, and FIG. 10B is a cross-sectional view of the contact sheet 3 and the collet 4 with the wall 43. It should be noted that the electrode pads 21 are omitted in FIGS. 10A and 10B for simplicity.

If the bare chip 2 is compressed onto the contact sheet 3 by means of the collet 4 without the wall 43, only portions of the contact sheet 3 located in facing relation with the bare chip 2 are deformed. When the contact sheet 3 is deformed, a portion of the contact sheet 3 around the deformed portions escapes towards a non-compressed portion.

A portion of the metal wire 35 encircled with a broken line S in FIG. 10A is inclined once when compressed, as shown with a solid line b. If the metal wire 35 remains inclined as illustrated in FIG. 10A, the metal wire 35 would stuck into the solder ball 22, ensuring electrical connection between the metal wire 35 and the solder ball 22.

However, in actual, a portion of the metal wire 35 encircled with the broken line escapes towards a non-compressed portion, that is, returns back to where it used to be. Namely, the metal wire 35 returns back to a position indicated with a broken line "a". Hence, the metal wire 35 slides on the solder ball 22 at a tip end thereof.

As a result, an electric resistance between the tip end of the metal wire 35 and the solder ball 22 becomes greater than an electric resistance in a case where the metal wire 35 sticks into the solder ball 22, causing a problem of insufficient electrical connection between an outermost solder ball and the associated connection pad 12.

In contrast, as illustrated in FIG. 10B, when the bare chip 2 is compressed onto the contact sheet 3 by means of the collet 4 with the wall 43, portions of the contact sheet 3 around portions making contact with the bare chip 2 are also compressed by the wall 43 of the collet 4. Hence, it would be possible to prevent the metal wire 35 from sliding around the outermost solder ball. Thus, it is ensured that the outer solder ball 22 makes electrical contact with the associated connection pad 12.

Figure 11:
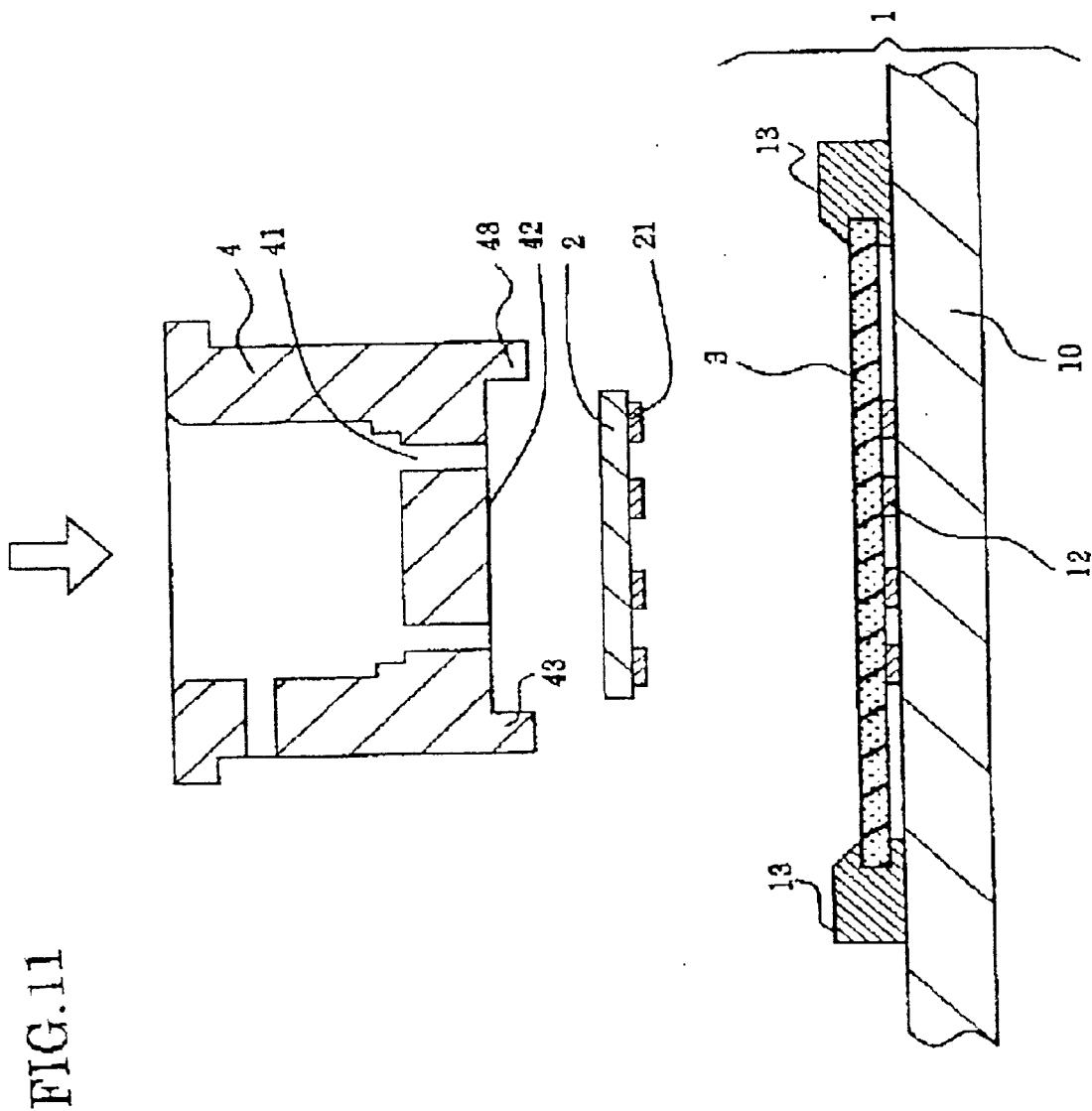
FIG. 11 is a cross-sectional view of a semiconductor device tester in accordance with an embodiment of the present invention, illustrating another frame for supporting the electrically conductive sheet therewith.

As illustrated in FIG. 11, the frame 13 may be designed to be formed with a recess in a horizontal plane, into which the contact sheet 3 is to be inserted at an outer edge thereof. This ensures that the contact sheet 3 can be surely fixed to the frame 13, and that the contact sheet 3 can be readily replaced with a new one together with the frame 13.

Figure 12:
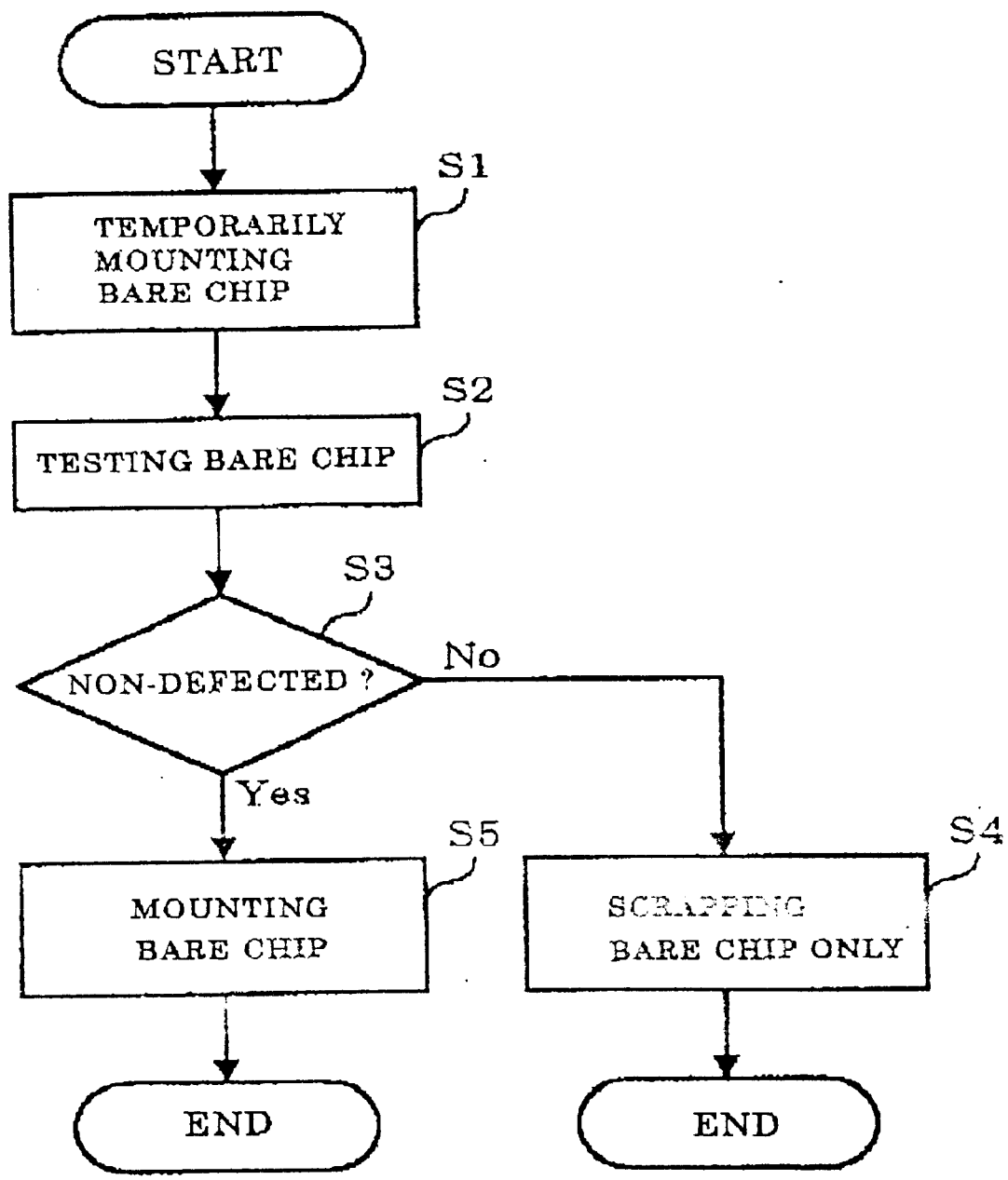
FIG. 12 is a flow chart of a method of testing a semiconductor device.

FIG. 12 is a flow chart showing steps to be carried out in a method of testing the bare chip 2.

First, the bare chip 2 is mounted onto the testing board 1 by means of the collet 4, in step S1.

Hereinbelow is explained how the bare chip 2 is held by the collet 4, with reference to FIGS. 13A to 13E.

It should be noted that the bare chip 2 is not always accurately illustrated with respect to a shape and a dimension.

First, as illustrated in FIG. 13A, a pick-up collet 7 is lowered to a tray 8 in which the bare chips 2 (only one bare chip is illustrated) are accommodated. The bare chips 2 are accommodated in the tray 8 such that the connection pads 21 face upwardly. The pick-up collet 7 has a silicone rubber 71 at a surface thereof.

The pick-up collet 7 adsorbs the bare chip 2 at the electrode pads 21 to thereby pick one of the bare chips 2 out of the tray 8, as illustrated in FIG. 13B.

Then, the pick-up collet 7 is turned upside down with the bare chip 2 being adsorbed thereto, as illustrated in FIG. 13C.

Then, as illustrated in FIG. 13D, an outer shape of the bare chip 2 is recognized by a camera 9 in order to adsorb the bare chip 2 at a center of the adsorption surface 42.

Then, the bare chip 2 is made to contact with the adsorption surface 42 of the collet 4. Thereafter, negative pressure is generated in the adsorption holes 41 to thereby adsorb a back surface of the bare chip 2 to the adsorption surface 42, as illustrated in FIG. 13E.

Figure 14:
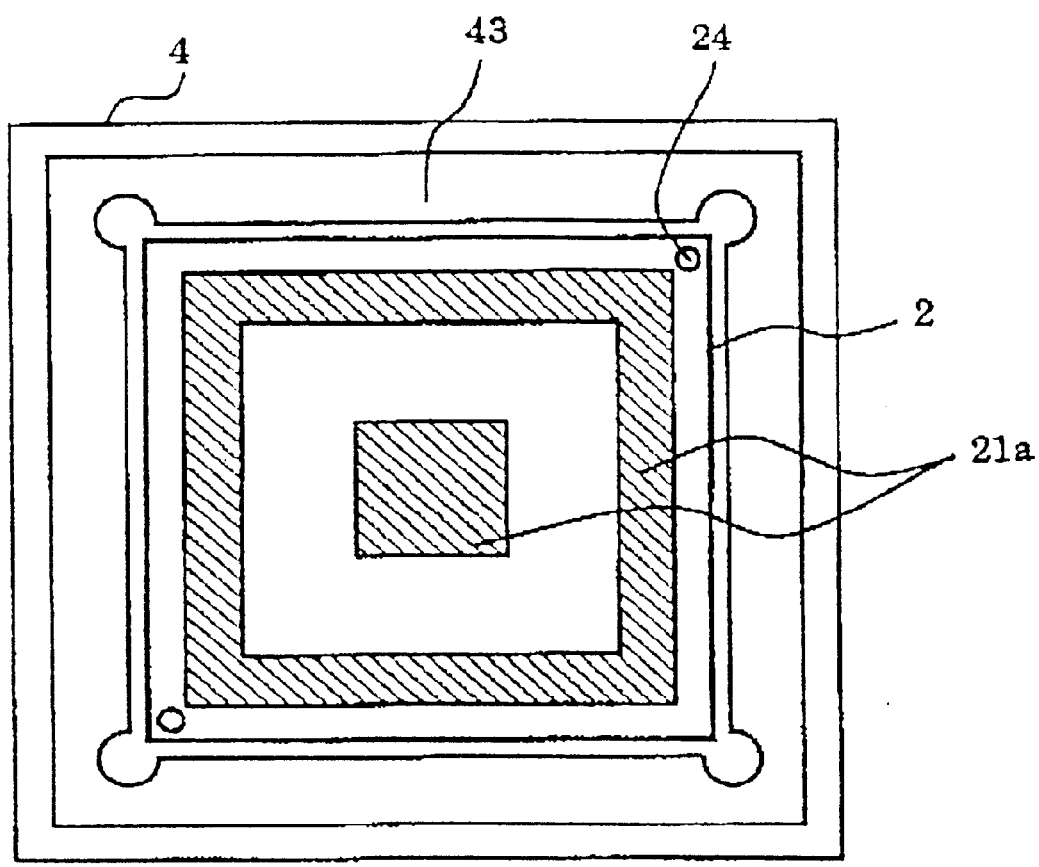
FIG. 14 is a bottom view of a collet holding a bare chip.

FIG. 14 illustrates a bottom of the collet 4 to which the bare chip 2 is adsorbed.

As illustrated in FIG. 14, the bare chip 2 is adsorbed centrally onto a bottom of the collet 4 with the electrode pads 21 face outwardly.

Then, a position of the collet 4 adsorbing the bare chip 2, relative to the testing board 1, is corrected.

Figure 15A:
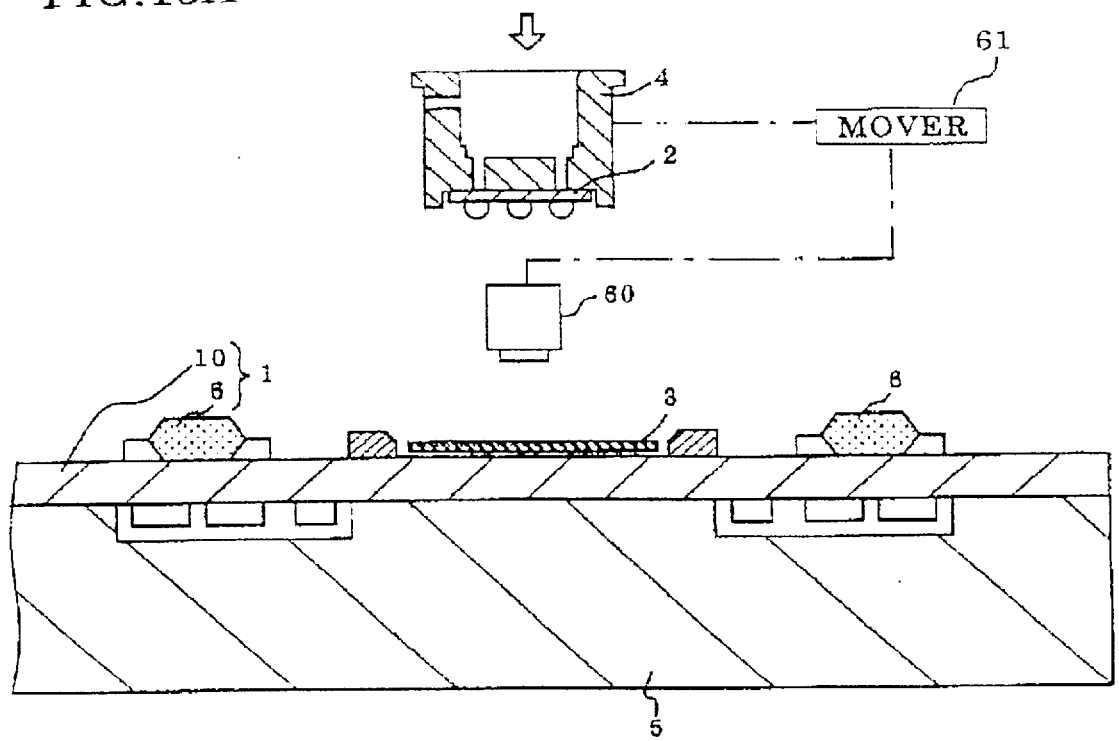
FIGS. 15A and 15B illustrate steps of correcting a positional relation between the holder holding a bare chip and the electrically conductive sheet.

In order to do so, as illustrated in FIG. 15A, the alignment marks 14 of the testing board 1 are recognized by a first camera 60. As illustrated in FIG. 4, two circles as the alignment marks 14 are located on a surface of the testing board 1 around the square mount area 11 and on a diagonal line of the mount area 11.

Then, the alignment marks 24 of the bare chip 2 are recognized by a second camera (not illustrated). As illustrated in FIG. 14, two circles as the alignment marks 24 are located around an area 21a in which the electrode pads 21 are arranged, and on a diagonal line of a square face of the bare chip 2.

The first camera 60 transmits a signal indicative of positions of the alignment marks 14, to a mover 61, and the second camera transmits a signal indicative of positions of the alignment marks 24, to the mover 61.

The mover 61 horizontally moves and/or rotates the collet 4 in accordance with those signals to thereby position the collet 4 just above to the contact sheet 3 such that the alignment marks 14 and 24 overlap each other when the collet 4 compresses the bare chip 2 onto the contact sheet 3.

An apparatus used when a semiconductor chip is mounted onto a substrate may be used also as the above-mentioned mover 61.

As illustrated in FIG. 6A, the metal wires 35 extend through the electrically insulating resin film 30 at an angle. Hence, when the bare chip 2 is temporarily mounted onto the testing board 1, the collet 4 is horizontally offset in accordance with a direction and an angle of the inclination of the metal wires 35.

Thus, the bare chip 2 is accurately positioned relative to the testing board 1 by virtue of the alignment marks 14 and 24.

When the alignment marks 14 and 24 are recognized by the first and second cameras, it is not necessary for the collet 4 to be located just above the mount area 11.

Figure 15B:
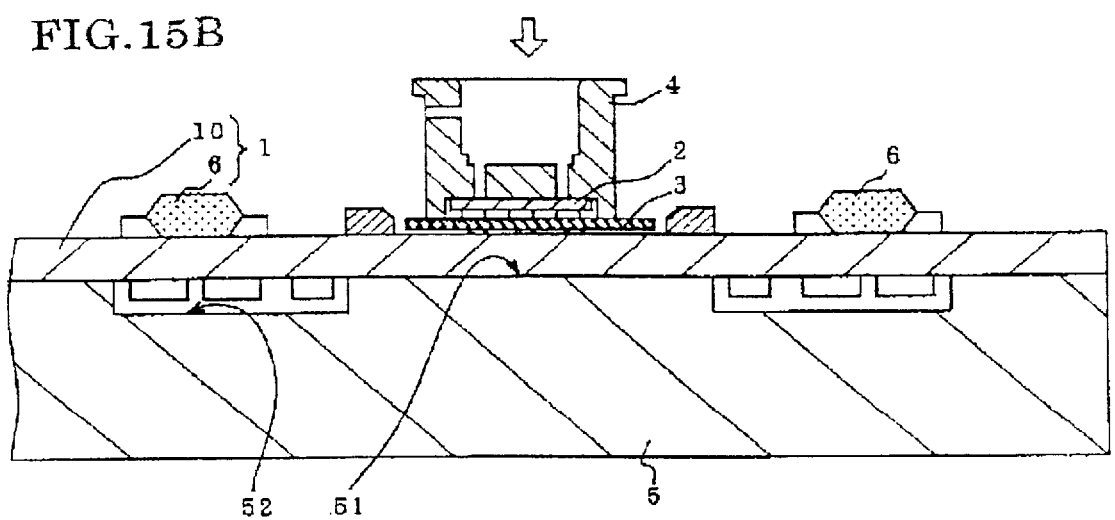

Then, as illustrated in FIG. 15B, the bare chip 2 is compressed onto the contact sheet 3 by means of the collet 4. Specifically, after the first and second cameras are displaced, the collet 4 is vertically lowered to thereby compress the bare chip 2 onto the contact sheet 3 to electrically connect the electrode pads 21 of the bare chip 2 and the connection pads 12 to each other. Thus, the bare chip 2 is temporarily mounted on the testing board 1.

Then, a test signal is input into and output from the bare chip 2 through the testing board 1. The testing board 1 includes the electronic components mounted thereon except the bare chip 2. Hence, a test signal can be input into or output from the bare chip 2 through the external connection terminals 15 of the testing board 1, regardless of the number and an arrangement pattern of the electronic components 6 except the bare chip 2.

In comparison with the pin type test wherein if components to be mounted on a printed wiring board are increased in number, the electrode pins are unavoidably increased in number, resulting in an increase in testing costs, the embodiment makes it possible to reduce testing costs, and accordingly, fabrication costs of a printed wiring board.

In addition, the bare chip 2 is tested being temporarily mounted on the testing board 1 on which all the electronic components except the bare chip 2 are mounted. Hence, a condition for testing the bare chip 2 can be substantially equalized to a condition in which the bare chip 2 is mounted on a substrate as a product. This ensures that the bare chip 2 is tested with high reliability.

In the embodiment, what exists between the bare chip 2 and the testing board 1 is just the contact sheet 3. Accordingly, a length of a transmission line through which a test signal is transmitted between the bare chip 2 and the testing board 1 can be shortened in comparison with the same in the conventional socket type test. As a result, a semiconductor chip transmitting and receiving radio-frequency signals having a frequency in the range of about 100 to 200 MHz, for instance, can be tested with high reliability.

Referring back to FIG. 12, the bare chip 2 is judged as to whether it is non-defective, in step S3, based on the results of the test having been carried out in the step S2.

If the bare chip 2 is judged defective (NO in step S3), only the bare chip 2 is scrapped in step S4. It is no longer necessary to scrap the printed wiring board 10 together.

Accordingly, it is now possible to reduce fabrication costs of a substrate on which the bare chip 2 is mounted.

If the bare chip 2 is judged non-defective (YES in step S4), the collet 4 is stopped adsorbing the bare chip 2 to thereby put the non-defective bare chip 2 into a tray (not illustrated) such that the electrode pads 21 face downwardly.

Then, the non-defective bare chip 2 is mounted on a printed wiring board in step S5.

The non-defective bare chip 2 may be mounted on a printed wiring board in a conventional manner. For instance, a pick-up collet adsorbs the bare chip 2 accommodated in a tray, at its back surface. Then, a position of the pick-up collet relative to the testing board 1 is corrected by means of the above-mentioned first and second cameras and the mover 61. Then, the bare chip 2 is mounted on a substrate, and sealed together with the substrate by resin. The substrate on which the bare chip 2 is mounted is subject to a board test, and shipped as a final product.

Since the bare chip 2 can be tested before being mounted on a printed wiring board, the step S2 for testing the bare chip 2 may be carried out concurrently with the step S5 for mounting the non-defective bare chip 2 onto a printed wiring board. Hence, a yield of fabricating a printed wiring board can be enhanced.

In accordance with the embodiment, it is not necessary to prepare testers for each kind of semiconductor chips, ensuring reduction in fabrication costs.

Figure 16:
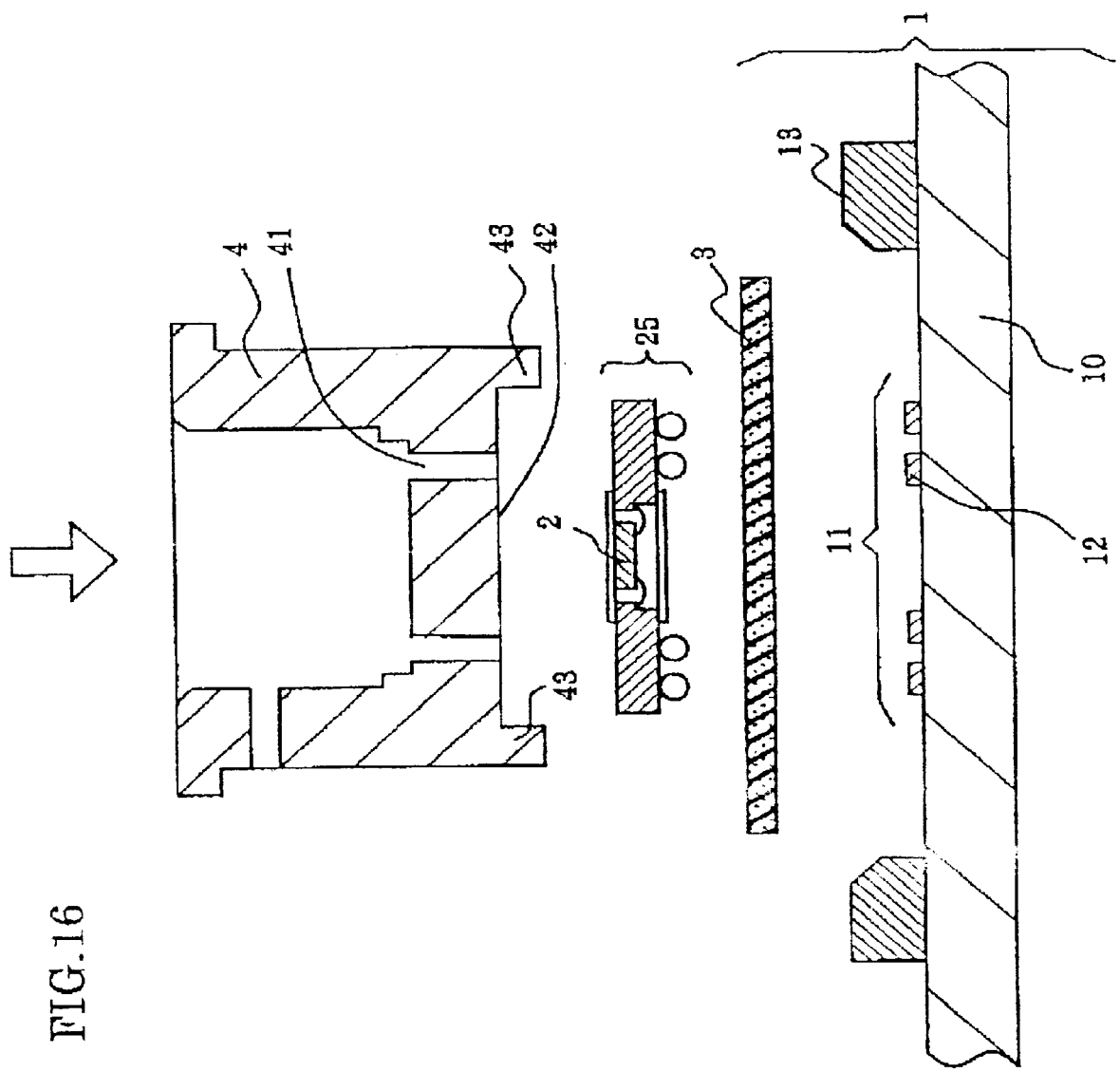
FIG. 16 is a cross-sectional view of a semiconductor device tester in accordance with an embodiment of the present invention, illustrating a ball grid array (BGA) being tested by the semiconductor device tester.

Though the bare chip 2 is tested in the above-mentioned embodiment, an object under test is not to be limited to the bare chip 2. For instance, as illustrated in FIG. 16, a package of BGA 25 may be tested by the semiconductor chip tester in accordance with the above-mentioned embodiment.

The semiconductor chip tester in accordance with the above-mentioned embodiment is suitable in particular for testing a semiconductor chip or BGA including pins in number equal to or greater than 2000 at a pitch equal to or smaller than 0.3 mm.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2000-99574 filed on Mar. 31, 2000 including specification, claims, drawings and summary is incorporated herein by reference in its entirety.

What is claimed is:

1. A semiconductor device tester comprising:
   (a) a tester substrate having the same structure as a structure of a substrate as a product except that a semiconductor device is not mounted on said tester substrate;
   (b) an electrically conductive sheet covering therewith a first area in which said semiconductor device is to be mounted on said tester substrate, said electrically conductive sheet being electrically insulating in a certain direction; and
   (c) a holder supporting said semiconductor device to be tested therewith, and compressing said semiconductor device onto said electrically conductive sheet to thereby electrically connect an externally projecting terminal of said semiconductor device to a connection terminal mounted on said tester substrate in said first area.

2. The semiconductor device tester as set forth in claim 1, wherein said electrically conductive sheet is comprised of:
   (b1) an insulating resin film; and
   (b2) electrical conductors in the form of a line, said electrical conductors extending through said insulating resin film in a thickness-wise direction of said insulating resin film at a first pitch equal to or smaller than a second pitch at which externally projecting terminals of said semiconductor device are arranged.

3. The semiconductor device tester as set forth in claim 2, wherein said electrical conductors are inclined relative to a normal line of said electrically conductive sheet.

4. The semiconductor device tester as set forth in claim 3, wherein said electrical conductors are inclined relative to a normal line of said electrically conductive sheet by an angle in the range of 10 to 45 degrees both inclusive.

5. The semiconductor device tester as set forth in claim 2, wherein said electrical conductors are S-shaped.

6. The semiconductor device tester as set forth in claim 2, wherein said electrical conductors extend through said insulating resin film vertically to a surface of said electrically conductive sheet.

7. The semiconductor device tester as set forth in claim 2, wherein said electrical conductors are bent such that an end of each of said electrical conductors is in alignment with the other end of each of said electrical conductors at opposite surfaces of said electrically conductive sheet.

8. The semiconductor device tester as set forth in claim 2, wherein said electrical conductors are composed of elastic material.

9. The semiconductor device tester as set forth in claim 1, wherein said electrically conductive sheet is comprised of
   (b1) an insulating film formed with through-holes in the same pattern as a pattern in which externally projecting terminals of said semiconductor device are arranged; and
   (b2) electrical conductors filling said through-holes therewith such that said electrical conductors project at opposite sides of said insulating film.

10. The semiconductor device tester as set forth in claim 1, wherein said holder includes an adsorption surface at which a surface opposite to a surface on which said externally projecting terminal is mounted is adsorbed, at least one hole formed in said adsorption surface, said semiconductor device being adsorbed to said holder at said adsorption surface by sucking said semiconductor device through said hole.

11. The semiconductor device tester as set forth in claim 10, wherein said holder includes a wall standing around said adsorption surface, said wall having a height equal to a sum of a thickness of said semiconductor device and a thickness of said externally projecting terminal.

12. The semiconductor device tester as set forth in claim 1, further comprising:
   (d) a detector which detects alignment marks of both said tester substrate and said semiconductor device and transmits a detection signal indicative of results of the detection; and
   (e) a mover which moves said holder relative to said tester substrate in accordance with said detection signal.

13. The semiconductor device tester as set forth in claim 1, wherein said tester substrate includes a frame formed thereon for inserting said electrically conductive sheet thereinto.

14. The semiconductor device tester as set forth in claim 13, wherein said frame is formed with a recess in a horizontal plane, said electrically conductive sheet being inserted at an outer edge thereof into said recess.

* * * * *